United States Patent
Aigner et al.

(10) Patent No.: US 6,401,544 B2
(45) Date of Patent: Jun. 11, 2002

(54) MICROMECHANICAL COMPONENT PROTECTED FROM ENVIRONMENTAL INFLUENCES

(75) Inventors: Robert Aigner; Christofer Hierold, both of München; Hergen Kapels, Neubiberg; Stefan Kolb, Unterschleissheim; Dieter Maier-Schneider, Markt Schwaben; Klaus-Günter Oppermann, Holzkirchen; Hans-Jörg Timme, Ottobrunn; Thomas Scheiter, Strasslach; Wolfgang Werner, München, all of (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/794,664

(22) Filed: Feb. 27, 2001

Related U.S. Application Data

(63) Continuation of application No. PCT/DE99/02698, filed on Aug. 27, 1999.

(30) Foreign Application Priority Data

Aug. 27, 1998 (DE) .......................... 198 39 122

(51) Int. Cl.$^7$ .............................. G01L 9/00; G01L 9/16
(52) U.S. Cl. ........................................... 73/754
(58) Field of Search .................. 73/715, 716, 717, 73/718, 719, 720, 721, 722, 723, 724, 725, 726, 727, 754; 257/417, 418, 419, 420, 467, 254; 29/621.1

(56) References Cited

U.S. PATENT DOCUMENTS

| | | | |
|---|---|---|---|
| 5,335,550 A | | 8/1994 | Satou ........................... 73/727 |
| 5,596,219 A | * | 1/1997 | Hierold ....................... 257/467 |
| 5,914,507 A | * | 6/1999 | Polla et al. .................. 257/254 |
| 6,051,866 A | * | 4/2000 | Shaw et al. .................. 257/417 |

FOREIGN PATENT DOCUMENTS

| | | |
|---|---|---|
| EP | 0 624 900 A2 | 11/1994 |
| EP | 0 822 398 A1 | 2/1998 |

* cited by examiner

*Primary Examiner*—William Oen
(74) *Attorney, Agent, or Firm*—Laurence A. Greenberg; Werner H. Stemer; Ralph E. Locher

(57) ABSTRACT

A method is disclosed for producing a micromechanical component. The micromechanical component has sensor holes, wherein at least one component protective layer and/or a spacer coating is applied on the component before separating the wafer into chips. The component protective layer sealingly covers at least the walls of the holes extending parallel to the surface of the wafer and perpendicular to the surface of the wafer and the spacer coating sealingly covers at least the walls of the holes extending parallel to the surface of the wafer.

11 Claims, 1 Drawing Sheet

MICROMECHANICAL COMPONENT PROTECTED FROM ENVIRONMENTAL INFLUENCES

CROSS-REFERENCE TO RELATED APPLICATION

This application is a continuation of copending International Application No. PCT/DE99/02698, filed Aug. 27, 1999, which designated the United States.

BACKGROUND OF THE INVENTION

FIELD OF THE INVENTION

The invention relates to a micromechanical component, preferably a micromechanical sensor. The component contains a wafer, a membrane, a cavity, one or more sacrificial layers serving as a support for the membrane, auxiliary layers, possibly electronics integrated into the component and at least one opening which establishes a connection between the membrane and the surroundings of the component.

Micromechanical components are described in a series of documents. U.S. Pat. No. 5,335,550 discloses for example a pressure sensor that is composed of two semiconductor substrates. Provided in one of the semiconductor substrates is a depression, which later serves as a cavity or vacuum chamber for the pressure sensor. Furthermore, resistors produced by diffusion and corresponding wiring are provided on the surface of the second semiconductor substrate. The two semiconductor substrates are connected to each other via an insulating film, so that the cavity is created under the resistors produced by diffusion on the rear side of the second semiconductor substrate.

Instead of producing the cavity by joining together two semiconductor substrates, the cavity may also be produced by isotropic etching. Published, European Patent Application EP 0 624 900 A3 discloses for example such a method of producing integrated sensors. For this purpose, starting from a substrate surface, trenches are produced in the substrate and are subsequently used for creating the actual cavity.

Micromechanical components, for example for use as microphone sensors, pressure sensors or acceleration sensors, are known for example from European Patent EP 0 714 017. The micromechanical components described have a cavity that is bounded on one side by a membrane layer, for example formed from metal or polysilicon. The membrane layer is made electrically conductive in one region and, together with a counterelectrode disposed on the opposite side of the cavity, forms an electrical capacitance which is used for measuring changes in volume of the cavity over time. According to an exemplary embodiment, above the membrane surface there may be disposed further layers, which have the effect of reinforcing the membrane. To improve the mobility of the membrane, openings reaching down to the top side of the membrane surface are etched into these additional layers. These openings may be of any desired form, for example round or angular. It is also possible for the openings to be channels which are annularly closed, for example in the form of a square or a circle.

The possibly large number of layers disposed above the membrane layer, and in particular the boundary surfaces in contact with the environment on account of the layers, in a micromechanical component of the type stated above require additional measures for protection from external environmental influences, such as atmospheric humidity etc., which can result in impairment of the function of the micromechanical component. If, for example, the component is in contact with an aggressive medium during a pressure measurement, the sensitive layers are chemically or physically attacked predominantly in the region of the locations where different layers are in contact. To protect the micromechanical component from external influences or to protect a pressure sensor from a pressure medium in contact with the sensor, the components have previously been encapsulated or enclosed in some other way after being separated into individual chips, for example with a rubber or by coating the component with a gel in a suitable housing.

SUMMARY OF THE INVENTION

It is accordingly an object of the invention to provide a micromechanical component protected from environmental influences which overcomes the above-mentioned disadvantages of the prior art devices and methods of this general type, which provides a micromechanical component protected from environmental influences, and is preferably a sensor, and manages without any additional measures for protecting the component after the wafer has been separated into individual chips.

With the foregoing and other objects in view there is provided, in accordance with the invention, a method for producing a micromechanical component. The method includes the steps of providing a wafer; producing a sacrificial layer on the wafer, the sacrificial layer having a cavity formed therein; providing a membrane supported on the sacrificial layer and extending over the cavity; and disposing auxiliary layers above the membrane and the sacrificial layer. The auxiliary layers are provided for at least one of planarizing a surface of the micromechanical component, for receiving conductor tracks and for receiving semiconductor devices. At least one opening is formed in the auxiliary layers, the opening establishes a connection between environmental surroundings and the membrane. A circuit protection layer is disposed on the auxiliary layers. A spacing coating is produced which covers and seals at least the side walls of the opening, the side walls running substantially perpendicular to a surface of the wafer. A component protection layer is applied over the opening and the auxiliary layers before separating the wafer into individual chips. The component protection layer covers and sealing a bottom of the opening running substantially parallel to the surface of the wafer and covers and seals the side walls of the at least one opening.

A further object of the invention is to provide a micromechanical component, preferably a micromechanical sensor, which does not have to be protected externally or encapsulated subsequently, for example after being separated into individual chips.

Furthermore, the invention relates to the use of the micromechanical component that can be produced by the method of the present invention for sensors, preferably microphones, pressure sensors or acceleration sensors, in particular for pressure sensors in airbags.

In accordance with an added mode of the invention, the step of producing the space coating, includes the steps of: applying at least one coating at least in a limited region parallel to the surface of the wafer, the limited region rising up above the at least one opening and the at least one coating largely adapting itself to a contour of the opening; and anisotropic etching the at least one coating such that the at least one coating is removed on surfaces running parallel to the surface of the wafer.

In accordance with another mode of the invention, there is the step of applying the component protection layer after applying the spacing layer. The component protection layer being applied in the limited region parallel to the surface of the wafer and rising up above the opening, and the component protection layer largely adapts itself to the contour of the opening and of the spacing coating.

With the foregoing and other objects in view there is provided, in accordance with the invention, a micromechanical component containing a wafer, at least one sacrificial layer disposed on the wafer and having a cavity formed therein, and a membrane supported on the at least one sacrificial layer and extending over the cavity, the membrane having a membrane surface on an upper side. Auxiliary layers are disposed above the membrane and the wafer for planarizing a component surface and for producing semiconductor electronic elements. The auxiliary layers have at least one opening formed therein connecting the membrane surface to environmental surroundings and the opening has side walls. A spacing coating is disposed on the side walls of the opening, and at least one component protection layer covers and seals a contour of the opening.

In accordance with an added feature of the invention, the wafer is formed of silicon.

In accordance with an additional feature of the invention, the membrane is formed of polysilicon or monocrystalline silicon.

In accordance with another feature of the invention, the auxiliary layers contain a semiconductor circuit, the semiconductor circuit serving for evaluating or driving the micromechanical component.

In accordance with a further feature of the invention, at least one circuit protection layer is disposed above the auxiliary layers. The circuit protection layer is formed of oxides and/or nitrides.

In accordance with a further added feature of the invention, the component protection layer contains titanium, titanium nitride and/or nitride.

In accordance with a concomitant feature of the invention, the spacing coating is formed of a nitride.

Other features which are considered as characteristic for the invention are set forth in the appended claims.

Although the invention is illustrated and described herein as embodied in a micromechanical component protected from environmental influences, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
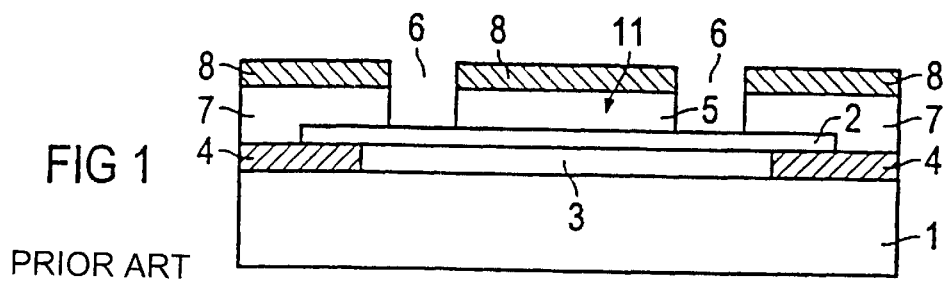
FIG. 1 is a diagrammatic, sectional view of a configuration known per se for a pressure sensor.

In all the figures of the drawing, sub-features and integral parts that correspond to one another bear the same reference symbol in each case. Referring now to the figures of the drawing in detail and first, particularly, to FIG. 1 thereof, there is shown a pressure sensor according to the prior art. The pressure sensor contains a silicon wafer 1 and a membrane layer 2 of polysilicon located above it. Between the wafer 1 and the membrane 2 there is a cavity 3. The membrane 2 is induced to undergo deflections or vibrations by externally applied pressures or pressure fluctuations. Between the wafer 1 and the membrane layer 2 there are additional layers 4, which are generally of an electrically insulating form. The membrane 2 lies laterally on the layers 4. Disposed above the membrane 2 are auxiliary layers 7, which may for example be sealing layers or planarizing layers. During the production of the sensor, a semiconductor circuit, likewise disposed on the chip of the sensor, can be produced by masking technology. The membrane surface of the sensor is then produced, for example together with gate electrodes of MOSFETs. To protect the auxiliary layers 7 or the additional semiconductor circuit elements from external influences, above the configuration there is a circuit protection layer 8 of a suitable material, preferably of an oxide or nitride, such as $SiO_2$ or $Si_3N_4$. In the last step, a collar-shaped opening 6 is made in the micromechanical sensor by etching, the etching process being stopped at a sensor surface. As a result, a residual structure is left behind on the membrane 2 and to a great extent determines the mechanical properties of the sensor. The openings 6 are preferably produced by a dry etching process.

Figure 2:
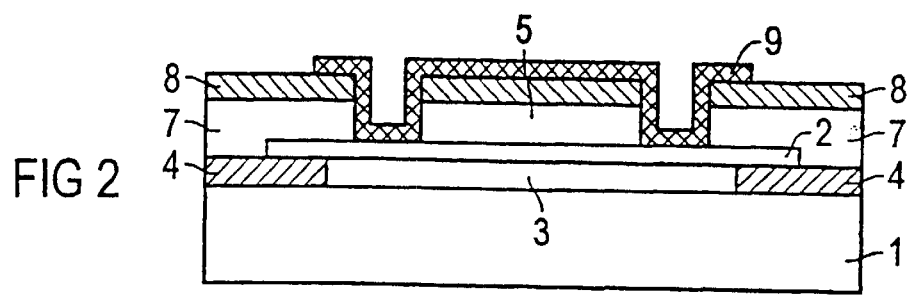
FIG. 2 is a sectional view of a pressure sensor according to the invention, with a component protection layer.

FIG. 2 shows the pressure sensor according to the invention with a component protection layer 9. The component protection layer 9 is applied in a region of the opening 6 to protect the sensitive flanks, in particular the layer transitions, and the chip surfaces which determine the properties of the component. The layer 9 closely follows the topological surface structure of the sensor in such a way as to provide complete sealing against external influences. The component protection layer 9 may preferably be produced by applying plasma nitride, titanium or titanium nitride. This particularly high-grade covering provides effective protection of the sensitive layer structures in the region of the opening 6. In principle, there is no need for additional protection of the sensor by an external housing. In the production of the pressure sensor according to FIG. 2, a region in which the component protection layer 9 comes to lie in a spatially bounded manner on the surface of the micromechanical sensor was defined by an additional mask. It is also possible for the component protection layer 9 first to be applied over the full surface area and, in a further step, for the component protection layer 9 to be removed again in the region of the areas adjacent to the openings 6 by local etching.

Figure 3:
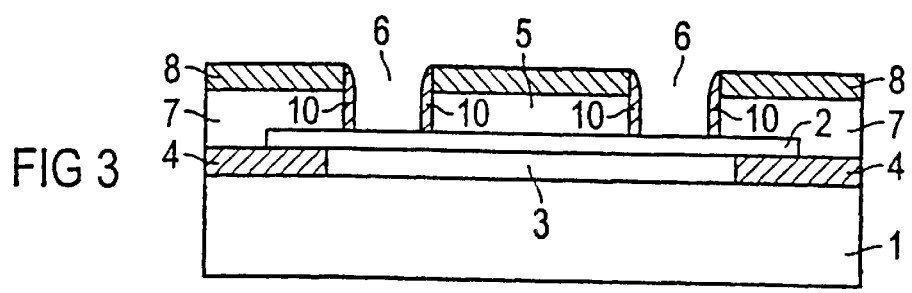
FIG. 3 is a sectional view of an alternative configuration for the pressure sensor according to the invention, with a spacer coating.

The micromechanical sensor according to FIG. 3 has spacing coatings 10 that have been applied to the flanks of the openings. The spacing coatings 10 only laterally cover the layers lying on the surface of the membrane 2. The spacing coatings 10 can be produced by depositing a protective layer, for example of one or more layers containing oxides, titanium, titanium nitride or nitride. A layer of a thin nitride is used with preference as the spacing coating 10. First, a layer that rises up at least beyond the openings 6 is deposited on the structure over the full surface area or in partial regions. Then, an anisotropic etching is carried out, for example without the additional use of a mask, leaving behind only the edges of the original layer. All parts of the layer running parallel to the wafer surface are removed by this etching. The remaining parts of the coating, running essentially perpendicular to the plane of the wafer, form the spacing coating 10.

Figure 4:
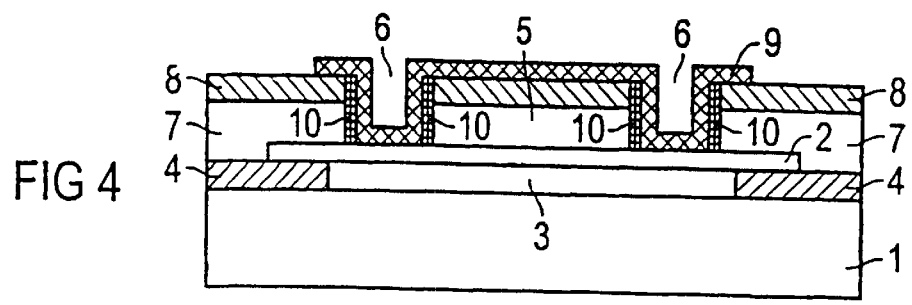
FIG. 4 is a sectional view of the configuration according to the invention, with the component protection layer and the spacing coating.

The preferred embodiment in FIG. 4 represents a combination of the methods indicated in FIGS. 2 and 3. First, the spacing coating 10 is produced in a way according to the method described in conjunction with FIG. 3. As a result, differences in topology, or in particular steep flanks, such as for example oxide edges, which would prevent uniform coverage are smoothed out in such a way that the application of the spacing coating 10 can take place in an improved way in the second step. The spacing coating 10 then leads to a protection of the sensor that is more resistant to external influences.

The method according to the present invention has the advantage that it manages without the use of process steps that are not available in a conventional process for producing CMOS, BiCMOS or bipolar semiconductor structures.

A further advantage of the invention is that no additional masks are required for the production of the spacing coating 10 in comparison with the production method of the sensor according to FIG. 1.

The micromechanical sensors produced according to the exemplary embodiments shown in FIGS. 2 to 4 are insensitive to external environmental influences, such as atmospheric humidity or water. In the case of the micromechanical sensors according to the invention there is no need for additional encapsulation to be carried out externally, for an enclosure or for protection of the sensor with a gel.

We claim:

1. A method for producing a micromechanical component, which comprises the steps of:
   providing a wafer;
   producing a sacrificial layer on the wafer, the sacrificial layer having a cavity formed therein;
   providing a membrane supported on the sacrificial layer and extending over the cavity;
   disposing auxiliary layers above the membrane and the sacrificial layer, the auxiliary layers provided for at least one of planarizing a surface of the micromechanical component, for receiving conductor tracks and for receiving semiconductor devices;
   forming at least one opening in the auxiliary layers, the at least one opening establishing a connection between environmental surroundings and the membrane;
   disposing a circuit protection layer on the auxiliary layers;
   producing a spacing coating covering and sealing at least side walls of the at least one opening, the side walls running substantially perpendicular to a surface of the wafer; and
   applying a component protection layer over the at least one opening and the auxiliary layers before separating the wafer into individual chips, the component protection layer covering and sealing a bottom of the at least one opening running substantially parallel to the surface of the wafer and covering and sealing the side walls of the at least one opening.

2. The method according to claim 1, wherein the producing of the space coating step, includes the steps of:
   applying at least one coating at least in a limited region parallel to the surface of the wafer, the limited region rising up above the at least one opening and the at least one coating largely adapting itself to a contour of the at least one opening; and
   anisotropic etching the at least one coating such that the at least one coating is removed on surfaces running parallel to the surface of the wafer.

3. The method according to claim 2, which comprises applying the component protection layer after applying the spacing layer, the component protection layer being applied in the limited region parallel to the surface of the wafer and rising up above the at least one opening, and the component protection layer largely adapting itself to the contour of the at least one opening and of the spacing coating.

4. A micromechanical component, comprising:
   a wafer;
   at least one sacrificial layer disposed on said wafer and having a cavity formed therein;
   a membrane supported on said at least one sacrificial layer and extending over said cavity, said membrane having a membrane surface on an upper side;
   auxiliary layers disposed above said membrane and said wafer for planarizing a component surface and for producing semiconductor electronic elements, said auxiliary layers having at least one opening formed therein connecting said membrane surface to environmental surroundings and said at least one opening having side walls;
   a spacing coating disposed on said side walls of said at least one opening; and
   at least one component protection layer covering and sealing a contour of said at least one opening.

5. The micromechanical component according to claim 4, wherein said wafer is formed of silicon.

6. The micromechanical component according to claim 4, wherein said membrane is formed of a material selected from the group consisting of polysilicon and monocrystalline silicon.

7. The micromechanical component according to claim 4, wherein said auxiliary layers contain a semiconductor circuit, the semiconductor circuit serving for one of evaluating and driving the micromechanical component.

8. The micromechanical component according to claim 4, including at least one circuit protection layer disposed above said auxiliary layers, said at least one circuit protection layer is formed of at least one mate rial selected from the group of oxides and nitrides.

9. The micromechanical component according to claim 4, wherein said at least one component protection layer contains at least one element selected from the group consisting of titanium, titanium nitride and nitride.

10. The micromechanical component according to claim 4, wherein the spacing coating is formed of a nitride.

11. A method of using a micromechanical component, which comprises the steps of:
    forming a micromechanical component containing:
      a wafer;
      at least one sacrificial layer disposed on the wafer and having a cavity formed therein;
      a membrane supported on the at least one sacrificial layer and extending over the cavity;
      auxiliary layers disposed above the membrane and the wafer for planarizing a component surface and for producing semiconductor electronic elements, the auxiliary layers having at least one opening formed therein connecting a membrane surface to environment surroundings on an upper side and the at least one opening having side walls;
      a spacing coating disposed on the side walls of the at least one opening; and
      at least one component protection layer disposed above the auxiliary layers and covering and sealing a contour of the at least one opening; and
    using the micromechanical component in a sensor.

* * * * *